(12) United States Patent
Takase

(10) Patent No.: US 6,423,137 B1
(45) Date of Patent: Jul. 23, 2002

(54) SINGLE CRYSTAL MATERIAL SUPPLYING APPARATUS AND SINGLE CRYSTAL MATERIAL SUPPLYING METHOD

(75) Inventor: Nobumitsu Takase, Annaka (JP)

(73) Assignee: Silicon Crystal Research Institute Corp., Gunma (JP)

( * ) Notice: Subject to any disclaimer, the term of this patent is extended or adjusted under 35 U.S.C. 154(b) by 0 days.

(21) Appl. No.: 09/403,626

(22) PCT Filed: Dec. 4, 1998

(86) PCT No.: PCT/JP98/05478

§ 371 (c)(1),
(2), (4) Date: Nov. 5, 1999

(87) PCT Pub. No.: WO99/46433

PCT Pub. Date: Sep. 16, 1999

(30) Foreign Application Priority Data

Mar. 12, 1998 (JP) .............................................. 10-80342

(51) Int. Cl.[7] .............................................. C30B 15/30
(52) U.S. Cl. ............................ 117/214; 117/33; 117/34
(58) Field of Search ............................. 117/214, 33, 34

(56) References Cited

U.S. PATENT DOCUMENTS 5,242,531 A * 9/1993 Klingshrin et al. ........... 117/34
5,324,488 A * 6/1994 Klingshirn et al. .......... 117/214
5,360,480 A * 11/1994 Altekruger ................... 117/214

FOREIGN PATENT DOCUMENTS

JP         3-193692   * 8/1991 ..................... 17/33

* cited by examiner

Primary Examiner—Robert Kunemund
(74) Attorney, Agent, or Firm—Connolly Bove Lodge & Hutz LLP

(57) ABSTRACT

The present invention aims to prevent solidification of a melt in a feeding pipe without providing heating means such as heater or heat keeping means such as heat insulating material on outer periphery of the feeding pipe when the melt is supplied from an auxiliary crucible into a main crucible via the feeding pipe by overflow. At the center of the auxiliary crucible 1 made of quartz, a pipe 1a for feeding the melt from the auxiliary crucible 1 to the main crucible 11 by overflow is formed. When the raw material in the auxiliary crucible is melted, it is designed in such manner that the raw material is not continuously supplied to the auxiliary crucible but it is supplied in such quantity that the melt overflows intermittently into an opening on the upper end of the pipe 1a from the auxiliary crucible 1 into the main crucible 11.

11 Claims, 3 Drawing Sheets

SINGLE CRYSTAL MATERIAL SUPPLYING APPARATUS AND SINGLE CRYSTAL MATERIAL SUPPLYING METHOD

TECHNICAL FIELD

The present invention relates to a single crystal material supplying, apparatus and a single crystal material supplying method for heating and melting a single crystal material in an auxiliary crucible and for supplying the melt to a main crucible in a single crystal pulling apparatus for manufacturing dislocation-free single crystal of silicon (Si) by Czochralski pulling method.

BACKGROUND ART

In general, in a single crystal manufacturing apparatus based on Czochralski pulling method, the pressure in a highly pressure-resistant airtight chamber is reduced to about 10 torr and fresh argon (Ar) gas is supplied into it, and polycrystal in a quartz crucible installed in the lower portion of the chamber is heated and melted. A seed crystal is immersed from above into the surface of the melt. Then, the seed crystal and quartz crucible are rotated and moved up and down, and the seed crystal is pulled so that a single crystal (the so-called ingot) is grown, which comprises an upper cone portion in conical shape with its upper end protruding under the seed crystal, a body portion in cylindrical shape, and a lower cone portion in conical shape with its lower end protruding.

As a conventional method to melt the raw material in an apparatus as described above, a method for supplying raw material to supplement the decrease of the melt in a crucible (hereinafter referred as "main crucible") for pulling up single crystal has been proposed. For example, JP-A-55-130894 discloses a method for melting raw material in an auxiliary crucible communicated with a main crucible and for additionally supplying the melt from the auxiliary crucible to the main crucible via a communicating pipe. Also, JP-A-56-164097 describes a method for supplying and melting solid raw material in an auxiliary crucible in a pulling apparatus from outside the pulling apparatus and for additionally supplying the melt from the auxiliary crucible to the main crucible.

However, in the method to continuously supply the melt from the auxiliary crucible to the main crucible via the feeding pipe in small quantity by overflow, there must be provided heating means such as heater or heat keeping means such as heat insulating material on outer periphery of the feeding pipe to prevent solidification of the melt in the feeding pipe. There is another method to melt a bar-like raw material by suspending it and to feed the melt by dropping without using the feeding pipe, but the raw material must be formed in bar-like shape in advance and it is also disadvantageous in that the feeding speed is low.

DISCLOSURE OF THE INVENTION

To solve the above problems, it is an object of the present invention to provide an apparatus and a method by designing in such manner that the melt in the auxiliary crucible overflows intermittently into an opening on the upper end of the feeding pipe and additional raw material is supplied intermittently in the auxiliary crucible so that overflow quantity is increased or that additional raw material is continuously supplied into the auxiliary crucible but surface tension of the melt in the auxiliary crucible itself is increased and the melt rises up above the opening of the pipe so that a predetermined quantity of the melt overflows at one time, or the above two procedures may be combined.

Specifically, the present invention provides a single crystal material supplying apparatus for heating and melting a single crystal raw material in an auxiliary crucible and for supplying the melt into a main crucible via a feeding pipe, characterized in that:

the apparatus comprises raw material supply means for supplying additional raw material intermittently into the auxiliary crucible in such quantity that the melt overflows intermittently into an opening at the upper end of the feeding pipe after the raw material in the auxiliary crucible has been melted.

Also, the present invention provides a single crystal material supplying apparatus for heating and melting a single crystal raw material in an auxiliary crucible and for supplying the melt into a main crucible via a feeding pipe, characterized in that:

edge of an opening on the upper end of the feeding pipe is deformed in such manner that the melt in the auxiliary crucible rises up to a given height above the opening at the upper end of the feeding pipe due to surface tension.

Further, the present invention provides a single crystal material supplying apparatus for heating and melting a single crystal raw material in an auxiliary crucible and for supplying the melt into a main crucible via a feeding pipe, characterized in that:

a high frequency coil for heating the raw material in the auxiliary crucible is arranged around the auxiliary crucible so that the melt in the auxiliary crucible rises up to a given height above the opening on the upper end of the feeding pipe due to convection.

Also, the present invention provides a single crystal material supplying apparatus for heating and melting a single crystal raw material in an auxiliary crucible and for supplying the melt into a main crucible via a feeding pipe, characterized in that:

the apparatus comprises raw material supply means for supplying additional raw material intermittently into the auxiliary crucible in such quantity that the melt overflows intermittently into the opening on the upper end of the feeding pipe after the raw material in the auxiliary crucible has been melted; and edge of the opening on the upper end of the feeding pipe is deformed in such manner that the melt in the auxiliary crucible rises up to a given height above the opening on the upper end of the feeding pipe due to surface tension.

Further, present invention provides a single crystal material supplying apparatus for heating and melting a single crystal raw material in an auxiliary crucible and for supplying the melt into a main crucible via a feeding pipe, characterized in that:

the apparatus comprises raw material supplying means for supplying additional raw material intermittently into the auxiliary crucible in such quantity that the melt overflows intermittently into the opening on the upper end of the feeding pipe after the raw material in the auxiliary crucible has been melted; and a high frequency coil for heating the raw material in the auxiliary crucible is arranged around the auxiliary crucible so that the melt in the auxiliary crucible rises up to a given height above the opening on the upper end of the feeding pipe due to convection.

Also, the present invention provides a single crystal material supplying apparatus for heating and melting a single crystal raw material in an auxiliary crucible and for supplying the melt into a main crucible via a feeding pipe, characterized in that:

a high frequency coil is arranged around the auxiliary crucible so that the melt in the auxiliary crucible rises up to a given height above the opening on the upper end of the feeding pipe due to convection; and edge of the opening on the upper end of the feeding pipe is deformed in such manner that the melt in the auxiliary crucible rises up to a given height above the opening on the upper end of the feeding pipe due to surface tension.

Also, the present invention provides a single crystal material supplying method for heating and melting a single crystal raw material in an auxiliary crucible and for feeding the melt into a main crucible via a feeding pipe, characterized in that the method comprises the step of:

feeding additional raw material intermittently into the auxiliary crucible in such quantity that the melt overflows intermittently into the opening on the upper end of the feeding pipe after the raw material in the auxiliary crucible has been melted.

Further, the present invention provides a single crystal material: supplying method for heating and melting a single crystal raw material in an auxiliary crucible and for feeding the melt into a main crucible via a feeding pipe, characterized in that the method comprises the step of:

increasing surface tension of the melt after the raw material in the auxiliary crucible has been melted.

Also, the present invention provides a single crystal material supplying method for heating and melting a single crystal raw material in an auxiliary crucible and for feeding the melt into a main crucible via a feeding pipe, characterized in that the method comprises the steps of:

feeding additional raw material intermittently into the auxiliary crucible in such quantity that the melt overflows intermittently into the opening on the upper end of the feeding pipe after the raw material in the auxiliary crucible has been melted; and increasing surface tension of the melt after the raw material in the auxiliary crucible has been melted.

BEST MODE FOR CARRYING OUT THE INVENTION

Figure 1:
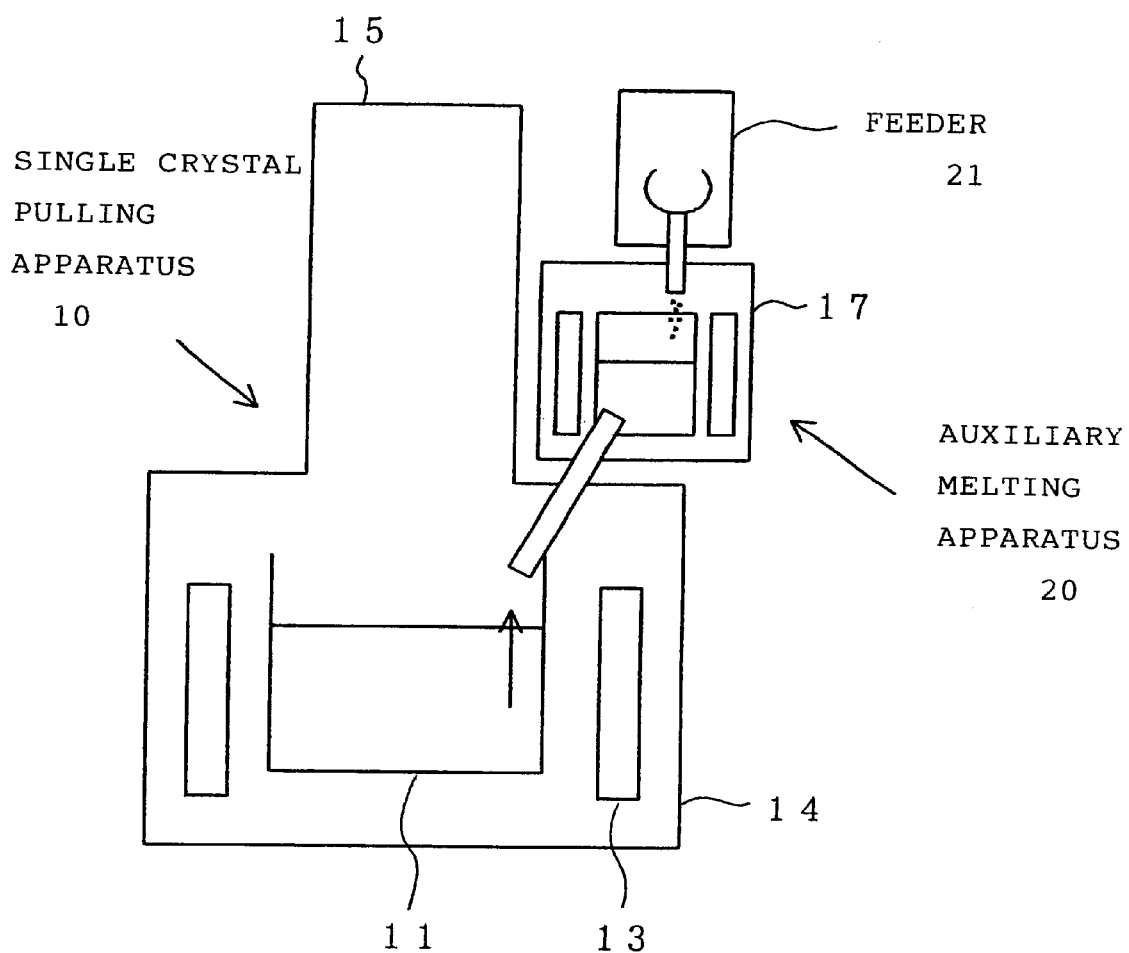
FIG. 1 is a schematical drawing of a single crystal pulling apparatus, to which a first embodiment of a single crystal material supplying apparatus of the present invention is applied.

In the following, description will be given on embodiments of the present invention referring to the attached drawings. FIG. 1 is a schematical drawing of a single crystal pulling apparatus, to which a first embodiment of a single crystal raw material supplying apparatus of the present invention is applied, and FIG. 2 is a drawing to explain a supplying method of a raw material supplying apparatus of FIG. 1.

In a single crystal pulling apparatus 10 shown in FIG. 1, a heater of cylindrical shape (not shown) is arranged around a main crucible 11 made of quartz, and a heat insulating material 13 of cylindrical shape is disposed around the heater. These component members 11 and 13 are arranged within a lower chamber 14. Although not shown in the figure, the main crucible 11 is supported by a carbon crucible, and the main crucible 11 and the carbon crucible are rotatably supported around a shaft so that these crucibles can be moved up and down in vertical direction. Also, an upper chamber 15 is disposed above the lower chamber 14, and a cable for pulling up the single crystal is suspended from the upper chamber 15 so that it can be moved in vertical direction and can be rotated around a shaft.

Figure 2:
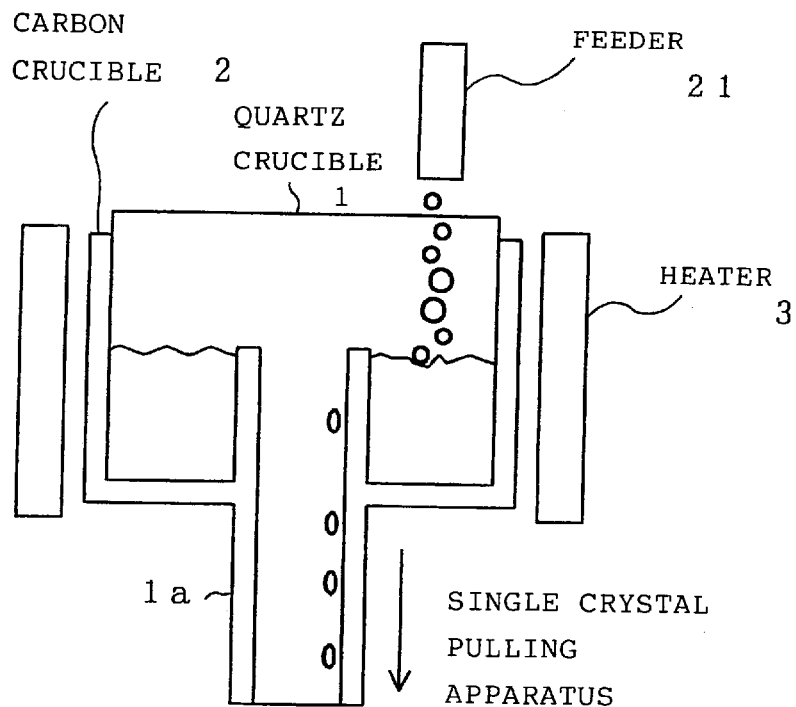
FIG. 2 is a drawing to explain a supplying method of the raw material supplying apparatus shown in FIG. 1.

Also, an auxiliary chamber 17 is arranged above the lower chamber 14, and an auxiliary melting apparatus 20 as shown in detail in FIG. 2 is placed in the auxiliary chamber 17 in order to supply the melt into the main crucible 11. Further, above the auxiliary melting apparatus 20, a feeder 21 for supplying solid grain-like material, i.e. raw material for the single crystal, is arranged. The inner space of the lower chamber 14 is communicated with the inner spaces of the upper chamber 15 and the auxiliary chamber 17, and these spaces are maintained at low pressure and are filled with inert gas such as argon.

Now, detailed description will be given on the auxiliary melting apparatus 20 referring to FIG. 2. At the center of the auxiliary crucible 1 made of quartz, a pipe 1a for supplying the melt from the auxiliary crucible 1 into the main crucible 11 by overflow is installed so that an opening at the upper end of the pipe 1a is protruded at a position about ½ of the height of the auxiliary crucible 1. The auxiliary crucible 1 is supported by a carbon crucible 2, and a heater 3 of resistance heating type is disposed around the carbon crucible 2.

In the arrangement as described above, a raw material is supplied from a feeder 21 into the auxiliary crucible 1 in such quantity as not to overflow into an opening at the upper end of a pipe 1a, and it is then heated by the heater 3. When the raw material in the auxiliary crucible 1 is melted, the melt in the auxiliary crucible 1 overflows intermittently into the opening of the upper end of the pipe 1a, and additional quantity of the raw material to be supplied to the main crucible is fed from the feeder 21 into the auxiliary crucible 1. The frequency of the intermittent feeding may be set, for example, to one time per minute. Next, when all of the raw material inside the auxiliary crucible 1 is heated by heater and is melted, additional raw material to be supplied to the main crucible 11 is fed from the feeder 21 into the auxiliary crucible 1 and the melt in the auxiliary crucible 1 is supplied into the main crucible 11 by overflow. Subsequently, by the same procedure, the raw material is fed from the feeder 21 intermittently, and not continuously, so that the melt in the auxiliary crucible 1 overflows intermittently to increase the overflow quantity. Thus, by reducing the time of contact with inner wall surface of the pipe 1a, the raw material is supplied to the main crucible 11.

Figure 3:
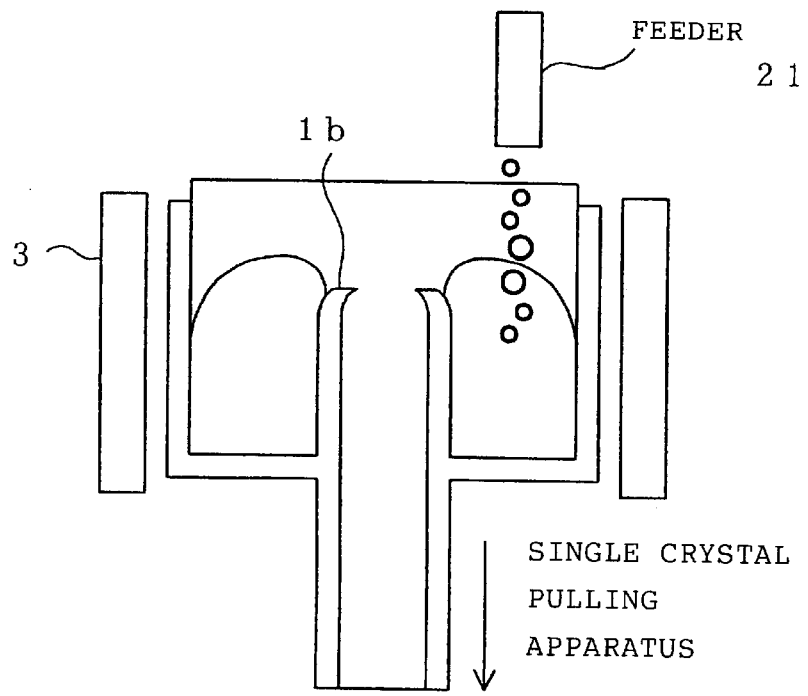
FIG. 3 is a schematical drawing of a raw material supplying apparatus of a second embodiment of the present invention.

In a second embodiment shown in FIG. 3, edge of an opening 1b of the pipe 1a is slightly deformed inwardly so that the melt in the auxiliary crucible 1 rises up to a predetermined height above the opening due to surface tension between the opening of the pipe 1a and inner wall of the auxiliary crucible 1. In case the pipe opening is not deformed, i.e. in case of the pipe opening shown in FIG. 2, the melt also rises up above the pipe opening due to surface tension, but the extent of the rising is higher than this when the edge of the opening is deformed. In this example, both outer diameter and inner diameter of the upper end of the pipe 1a are reduced in tapered shape. Because it is outer peripheral portion of the pipe 1a which gives influence on surface tension, similar effect can be obtained if outer diameter of the pipe end is designed in tapered shape.

The other details are the same as in the first embodiment. However, there is no need to supply the raw material intermittently into the auxiliary crucible as in the first embodiment. When the rising of the melt with respect to the opening reaches a given height, top portion of the melt thus risen up collapses, and a given quantity of the melt flows into the pipe 1a at one time, and the melt can be intermittently supplied in automatic manner. Therefore, with the arrangement as described above, after the raw material in the auxiliary crucible 1 is heated by the heater 3 and melted, the melt in the auxiliary crucible 1 is supplied by overflow. When the quantity of the raw material to be supplied to the main crucible 11 is additionally supplied into the auxiliary crucible 1 from the feeder 21, the more quantity of the raw material (i.e. in such extent as caused by the rising due to surface tension) overflows than in the first embodiment and is supplied into the main crucible. This makes it possible to reduce the time of contact with the inner wall surface of the pipe 1a.

Figure 4:
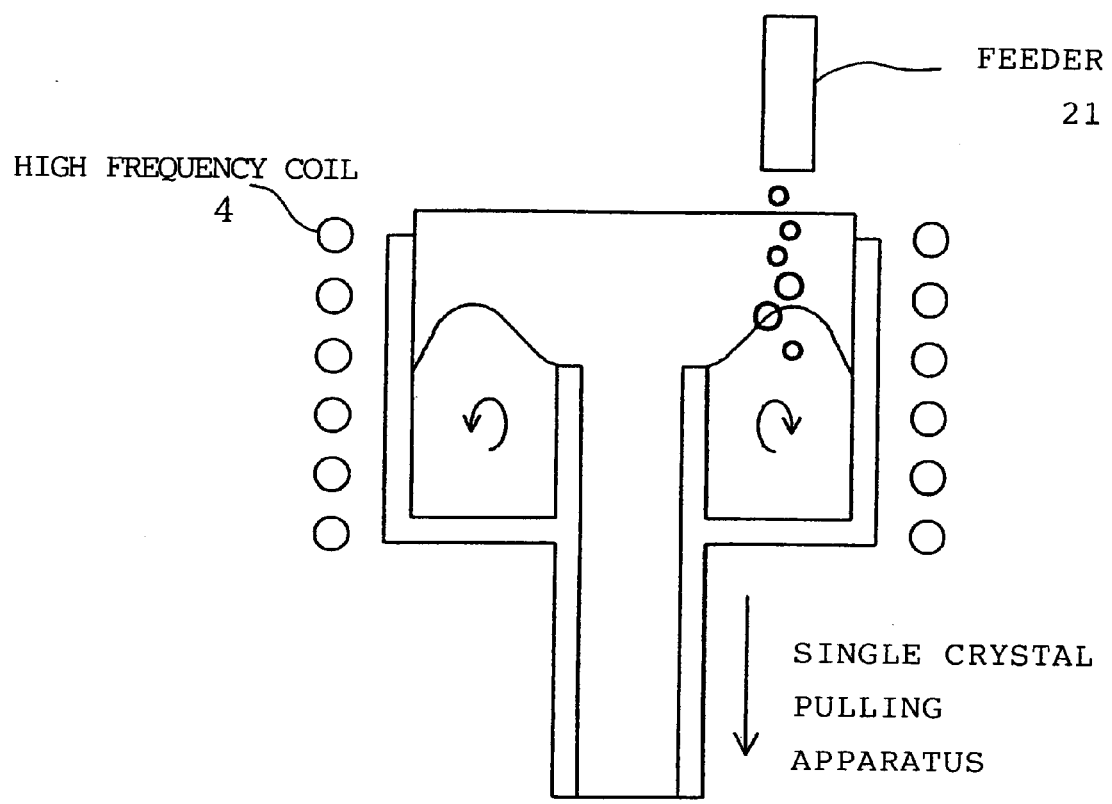
FIG. 4 is a schematical drawing of a raw material supplying apparatus of a third embodiment of the present invention.

In a third embodiment shown in FIG. 4, a high frequency coil 4 of induction heating type is arranged instead of the heater 3 of resistance heating type. The other details are the same as in the first embodiment. In this arrangement, when high frequency current is applied on the high frequency coil 4, Joule heat is generated on the raw material in the auxiliary crucible 1 due to secondary induction current and the raw material is melted. Due to convection caused by the high frequency coil 4, the melt in the auxiliary crucible 1 rises up between the opening of the pipe 1a and the inner wall of the auxiliary crucible 1. In this embodiment, surface tension is increased more than in the second embodiment, or it looks as if surface tension is increased regardless of whether it actually rises up or not. Even when the melt rises up higher than the critical height of the rising from the opening as in the second embodiment, i.e. higher than the height of the rising to start to flow into the pipe 1a, the melt does not flow in, and this makes it possible to supply larger quantity of the raw material at one time.

Therefore, when additional raw material of the quantity to be supplied to the main crucible 11 by overflow from the auxiliary crucible 1 is fed into the auxiliary crucible from the feeder 21, more quantity of the raw material than in the first and the second embodiments overflows into the main crucible 11, i.e. by the increased quantity of the rising due to convection, and this makes it possible to reduce further the time of contact with inner wall surface of the pipe 1a. Similarly to the second embodiment, there is no need to supply the raw material intermittently into the auxiliary crucible as in the first embodiment. When the rising of the melt reaches a given height with respect to the pipe opening, top portion of the melt thus risen up collapses, and a given quantity of the melt flows into the pipe 1a at one time. Thus, intermittent supply can be provided automatically.

In the field of single crystal pulling technique, it is widely known that a coil or the like is arranged around the main crucible 11 to generate longitudinal magnetic field or transverse magnetic field or cusp type magnetic field in order to prevent convection of the melt in the main crucible 11 during single crystal pulling process. In contrast, according to the present invention, the melt in the auxiliary crucible 1 is intentionally moved in convection to increase the overflow quantity of the melt and to supply it to the main crucible 11. Also, by combining the first, the second and the third embodiments, it is possible to induce overflow of more quantity of the raw material. That is, the first embodiment may be combined with the second embodiment, or the first embodiment may be combined with the third embodiment, or the second embodiment may be combined with the third embodiment, or the first embodiment, the second embodiment and the third embodiment may be combined together.

INDUSTRIAL APPLICABILITY

As described above, according to the present invention, additional raw material is intermittently supplied into the auxiliary crucible so that the melt in the auxiliary crucible intermittently overflows into the opening on the upper end of the feeding pipe and the overflow quantity is increased or additional raw material is continuously supplied into the auxiliary crucible while surface tension of the melt in the auxiliary crucible itself is increased so that the melt rises up with respect to the pipe opening and larger quantity of the melt overflows at one time, or the above two methods may be combined together. As a result, there is no need to provide heating means such as heater or heat keeping means such as heat insulating material on outer periphery of the feeding pipe, and it is possible to prevent solidification of the melt in the feeding pipe.

What is claimed is:

1. A single crystal material supplying apparatus for heating and melting a single crystal raw material in an auxiliary crucible and for supplying the melt into a main crucible via a feeding pipe, wherein:

said apparatus comprises raw material supply means for supplying additional raw material intermittently into said auxiliary crucible in such quantity that the melt overflows intermittently into the opening on an upper end of said feeding pipe after the raw material in said auxiliary crucible has been melted; and an edge of the opening on the upper end of said feeding pipe is deformed in such manner that the melt in said auxiliary crucible rises up to a given height above the opening on the upper end of said feeding pipe due to surface tension.

2. The single crystal raw material supplying apparatus according to claim 1, characterized in that:

a high frequency coil for heating the raw material in said auxiliary crucible is arranged around said auxiliary crucible so that the melt in said auxiliary crucible rises up to a given height above the opening on the upper end of said feeding pipe due to convection.

3. A single crystal material supplying apparatus for heating and melting a single crystal raw material in an auxiliary crucible and for supplying the melt into a main crucible via a feeding pipe, wherein:

said apparatus comprises raw material supply means for supplying additional raw material intermittently into said auxiliary crucible in such quantity that the melt overflows intermittently into the opening on an upper end of said feeding pipe after the raw material in said auxiliary crucible has been melted; and a high frequency coil for heating the raw material in said auxiliary crucible is arranged around said auxiliary crucible so that the melt in said auxiliary crucible rises up to a given height above the opening on the upper end of said feeding pipe due to convection.

4. A single crystal material supplying apparatus for heating and melting a single crystal raw material in an auxiliary crucible and for supplying the melt into a main crucible via a feeding pipe, wherein:

a high frequency coil is arranged around said auxiliary crucible so that the melt in said auxiliary crucible rises up to a given height above the opening on the upper end of said feeding pipe due to convection; and an edge of the opening on the upper end of said feeding pipe is deformed in such manner that the melt in said auxiliary crucible rises up to a given height above the opening on the upper end of said feeding pipe due to surface tension.

5. A single crystal material supplying method for heating and melting a single crystal raw material in an auxiliary crucible and for feeding the melt into a main crucible via a feeding pipe, characterized in that said method comprises the step of:

increasing surface tension of the melt after the raw material in said auxiliary crucible has been melted.

6. A single crystal material supplying method for heating and melting a single crystal raw material in an auxiliary crucible and for feeding the melt into a main crucible via a feeding pipe, wherein said method comprises the step of:

feeding additional raw material intermittently into said auxiliary crucible in such quantity that the melt overflows intermittently into the opening on an upper end of said feeding pipe after the raw material in said auxiliary crucible has been melted; and increasing surface tension of the melt after the raw material in said auxiliary crucible has been melted.

7. The single crystal material supplying apparatus according to claim 1, wherein:

the opening on the upper end of said feeding pipe is protruded to a given height above the bottom surface of said auxiliary crucible.

8. The single crystal material supplying apparatus according to claim 3, wherein:

the opening on the upper end of said feeding pipe is protruded to a given height above the bottom surface of said auxiliary crucible.

9. The single crystal material supplying apparatus according to claim 4, wherein:

the opening on the upper end of said feeding pipe is protruded to a given height above the bottom surface of said auxiliary crucible.

10. The single crystal material supplying apparatus according to claim 1, wherein:

outer diameter of the opening on the upper end of said feeding pipe is reduced in tapered shape.

11. The single crystal material supplying apparatus according to claim 4, wherein:

outer diameter of the opening on the upper end of said feeding pipe is reduced in tapered shape.

* * * * *